United States Patent
Barker

Patent Number: 6,144,085
Date of Patent: Nov. 7, 2000

[54] POWER TRANSISTOR DEVICE HAVING HOT-LOCATION AND COOL-LOCATION TEMPERATURE SENSORS

[75] Inventor: Richard J. Barker, Stockport, United Kingdom

[73] Assignee: U.S. Philips Corporation, New York, N.Y.

[21] Appl. No.: 09/377,359

[22] Filed: Aug. 19, 1999

[30] Foreign Application Priority Data

Aug. 20, 1998 [GB] United Kingdom .................. 9818044

[51] Int. Cl.$^7$ .................................................. H01L 29/78
[52] U.S. Cl. .......................... 257/467; 257/108; 257/337; 257/470
[58] Field of Search .................................. 257/108, 467, 257/334, 337, 469, 470

[56] References Cited

U.S. PATENT DOCUMENTS

| | | | |
|---|---|---|---|
| 4,931,844 | 6/1990 | Zommer ................................. | 357/23.4 |
| 5,336,943 | 8/1994 | Kelly et al. ............................. | 307/310 |
| 5,444,219 | 8/1995 | Kelly ...................................... | 219/505 |
| 5,726,481 | 3/1998 | Moody ................................... | 257/467 |
| 5,828,263 | 10/1998 | Gantioler et al. ...................... | 327/512 |
| 5,886,515 | 3/1999 | Kelly ...................................... | 323/313 |
| 5,994,752 | 11/1999 | Sander et al. .......................... | 257/467 |

FOREIGN PATENT DOCUMENTS

0338516A2  10/1989  European Pat. Off. ............... 257/467

*Primary Examiner*—Donald L. Monin, Jr.
*Attorney, Agent, or Firm*—Steven R. Biren

[57] ABSTRACT

A power transistor device, for example a MOSFET or an IGBT, comprises a semiconductor body (10) which accommodates an array (11) of parallel device cells (1a) in which heat is generated in operation of the device. A hot-location temperature sensor (Mh) is located inside the array (11), and a cool-location temperature sensor (Mc) is located outside the array (11). These sensors each comprises at least one sensor cell (1b; 1c) which is of the same transistor type as the device cells (1a). The sensor cells (1b; 1c) have a cellular region structure (12,13,14,15) similar to that of the device cells (1a), but each sensor (Mh; Mc) has a respective output electrode (31; 32) separate from electrodes (22,23,25) of the device cells (1a). A detection circuit (100,101) is coupled to the respective output electrodes (31; 32) of the hot-location and cool-location temperature sensors (Mh; Mc) for detecting a temperature difference between the hot and cool locations by comparing voltage signals (dV(T)) from the output electrodes (31; 32).

10 Claims, 5 Drawing Sheets

POWER TRANSISTOR DEVICE HAVING HOT-LOCATION AND COOL-LOCATION TEMPERATURE SENSORS

BACKGROUND OF THE INVENTION

This invention relates to power transistor devices, particularly but not exclusively of insulated-gate type, for example an insulated-gate power field-effect transistor (hereinafter termed MOSFET) or an insulated-gate bipolar transistor (hereinafter termed IGBT), wherein the device comprises a semiconductor body which accommodates an array of parallel device cells in which heat is generated in operation of the device, and wherein a hot-location temperature sensor is located inside the array of device cells.

United States patent specification U.S. Pat. No. 4,913,844 discloses such a device, wherein the device cells of an insulated-gate transistor type have a cellular region structure in the semiconductor body adjacent to a body surface at which a common source electrode and a common insulated-gate electrode are present. The hot-location sensor comprises at least one sensor cell which has a cellular region structure similar to that of the device cells. Its one or more sensor cells has/have an insulated-gate electrode which is coupled in common with that of the device cells and has/have a source electrode which is separate from the common source electrode of the device cells and which forms an output electrode that is coupled to a detection circuit.

For temperature sensing, U.S. Pat. No. 4,913,844 teaches the adoption of a current mirror arrangement of two such sensors inside the array. One of these hot-location sensors is used in a current sensing mode by coupling its source electrode to the device source terminal via a low value resistor, while the other hot-location sensor is used in a voltage sensing mode by coupling its source electrode to the device source terminal via a high value resistor. The temperature of the array is detected by calculating the on-resistance (from the source outputs of the voltage sensor and of the current sensor) and correlating the resistance value with the known temperature dependence of the on-resistance.

This is a complicated way to sense the temperature it also relies on the device cells and voltage sensing cells being operated in the saturation region of the device, in order that the voltage across the high value resistor equals (to a great degree of accuracy) the voltage on the drain of the voltage sensor and hence the voltage on the drain of the power device array. However, the saturation region is of less interest for monitoring excessive temperature increases within the array, because the power dissipation is low in the saturation region due to the very low voltage drop across the device (even though the current through the device is high).

United States patent specification U.S. Pat. No. 5,444,219 (our ref: PHB33667) discloses a temperature sensor in the form of a resistor, and also a differential temperature sensing circuit comprising such temperature-sensitive resistors at a hot location adjacent to the device array and at a cool location remote from the array. The hot-location and cool-location temperature-sensitive resistors are arranged in a Wheatstone bridge circuit in order to achieve sufficient sensitivity. This use of hot-location and cool-location temperature-sensitive resistors does not require the device cells to be operated in the saturation region. In a specific embodiment the hot-location temperature-sensitive resistor is outside the array at a distance of, for example, 125 $\mu$m (micrometers) from the periphery of the array. However, it is suggested that the hot-location temperature-sensitive resistor may be positioned centrally within the array, although this arrangement will disrupt locally the regularity of the array. The whole contents of both U.S. Pat. No. 5,444,219 and U.S. Pat. No. 4,913,844 are hereby incorporated herein as reference material.

SUMMARY OF THE INVENTION

It is an aim of the present invention to provide a power transistor device with hot-location and cool-location temperature sensors which can be readily integrated with the power device array and which provide, in a simple detectable manner, a fast but reliable response to an excessive temperature increase within the array and which can operate when the device is not operating in its saturation region.

According to the present invention, there is provided a cellular power transistor device having both hot-location and cool-location temperature sensors which each comprise at least one sensor cell having a cellular region structure similar to that of the transistor device cells, and the detection circuit detects a temperature difference between the hot and cool locations by comparing output signals from the hot-location and cool-location temperature sensors, for example by comparing gate-source voltage signals as a difference in source voltage at separate source electrodes of the hot-location and cool-location temperature sensors in the case of an insulated-gate transistor device.

The use of such a temperature-sensing arrangement in accordance with the invention permits detection of an excessive temperature increase within the array in the important situation when the transistor device is not operating in its saturation region. It is therefore functional when the power dissipation in the device is high in a non-saturated on-state, i.e. when the voltage across the device is still quite high. The use of one or more cells inside the array to form the hot-location sensor can provide a very fast response to temperature increases within the array. Thus, the hot-location sensor cell (or cells) may be closely bounded by heat-generating device cells on all sides, or at least on most sides. Although typical variations in threshold voltage for the sensor cells arising from the manufacturing process may be of higher magnitude than the threshold-voltage change due to temperature change, reliable detection of temperature changes is achievable by comparing the voltage signals from these hot-location and cool-location temperature sensor cells in accordance with the invention, so effectively cancelling threshold-voltage variations arising from manufacture.

To facilitate simple but reliable comparison of output signals from the hot-location and cool-location temperature sensors, the detection circuit may comprise respective current sources which are coupled in respective current paths to the respective output electrodes of the temperature sensors for drawing a current of the same magnitude (same current density) through each sensor cell of the magnitude of the current being insufficient to generate heat in the sensor cells.

The power device may be of the cellular bipolar transistor type, in which a difference in base-emitter voltage (Vbe) between the hot-location and cool-location sensors is compared for detecting the temperature difference between the hot and cool locations. Thus, the cellular region structure of the device and of the temperature sensors may each comprise emitter, base and collector regions formed in the semiconductor body, using known bipolar technology. The sensor cells may have a base electrode which is coupled to the same potential for each temperature sensor and have an emitter electrode which provides the respective output electrode for each temperature sensor. The device cells of the array may have a common emitter electrode and a common base electrode. The device may be solely a bipolar transistor, or the bipolar transistor may be an integral part of a more complex device, for example a thyristor. The base-emitter voltage of a bipolar transistor cell is strongly dependent on temperature, but the magnitude of output voltage achievable with such a bipolar transistor cell is generally much smaller than that achievable as an output voltage from an insulated-gate transistor cell.

Thus, preferably, the device is an insulated-gate transistor type, for example a MOSFET or an IGBT. The sensor cells may have an insulated-gate electrode which is coupled to the same potential for each temperature sensor and have a source electrode which provides the respective output electrode for each temperature sensor. The device cells of the array may have a common source electrode and a common insulated-gate electrode. In this case, the detection circuit detects a temperature difference between the hot and cool locations by comparing gate-source voltage signals from the hot-location and cool-location temperature sensors. The present invention may be used with trench-gate cell devices or with surface-gate cell devices. In the first case, the insulated gate is present in a trench in a major surface of the body. In the latter case, the insulated gate is present on the major surface.

Each temperature sensor may comprise a single respective sensor cell. However it is advantageous to provide more than one sensor cell for each sensor, in order to average out any local peculiarities which may occur in/on the semiconductor body in device manufacture and which may locally affect the output voltage of the cell. Thus, each sensor may advantageously comprise a small number (for example, in the range of three to seven) of active sensor cells.

The hot-location temperature sensor may comprise a plurality of the sensor cells arranged in a row that is bounded along its longitudinal sides by heat-generating device cells of the array. This row arrangement optimises thermal coupling between the heat-generating device cells of the array and the sensor cells of the hot-location temperature sensor. When the cool-location temperature sensor is located sufficiently close to the array as to be in a decreasing temperature gradient from the heat-generating array, it is advantageous to arrange plural sensor cells of the cool-location sensor in a row that extends parallel to an edge of the array. Otherwise, plural sensor cells of the cool-location temperature sensor do not need to be implemented as a row. Indeed an optimisation and saving in device layout area may be achieved when the sensor cells of the cool-location temperature sensor are arranged in a 2-dimensional grouping.

The coupling to the output electrode of the hot-location sensor may comprise a conductor track which extends over a line of the device cells in the array and which is electrically isolated from a corresponding electrode of the device cells, for example from a common source electrode of the array in the case of an insulated-gate transistor type. This line track coupling is more reliable than bonding a flying wire to the output electrode of the hot-location sensor inside the array. The device cells of the line may be inactive cells of the array, and/or the conductor track may be electrically isolated from the device cells of the array (for example, from their common source/emitter electrode and/or gate/base electrode and/or cellular region structure) by an intermediate insulating layer.

Inactive cells may be formed in various ways. The common source/emitter electrode of the array and/or the source/emitter region may be absent from the device cells of the line over which the conductor track extends. In the preferred case of an insulated-gate transistor type, a source region of the cellular region structure may be absent from adjacent to the insulated-gate electrode of the device cells of the line and/or absent from a contact window for the source/emitter electrode or for the conductor track. Such arrangements may be used with trench-gate cells or with surface gate cells. At least with surface-gate cells, the common insulated-gate electrode and the common source electrode of the array may be absent from the device cells of the line over which the conductor track extends.

The sensor cell of the hot-location sensor may have a common insulated-gate electrode with the device cells, and the sensor cell of the cool-location temperature sensor may have its insulated-gate electrode coupled in common with that of the device cells. A compact layout can be achieved using these features in a power transistor device of the insulated-gate type.

The cool-location temperature sensor may have its one or more sensor cells located remote from the array of device cells. However, especially when another temperature sensor is included to monitor the actual temperature (so-called "absolute temperature") near the array, then it can be advantageous to locate the cool-location sensor close to the absolute temperature sensor, and hence close to the outer periphery of the array. In such a case, the cool-location sensor may even share a common peripheral cellular termination structure with the device array. Interconnections and layout may also be simplified when the cool-location sensor shares a common electrode connection (for example, a common insulated-gate layer) with the hot-location sensor, and even also with the device cells of the array.

In addition to the device array and the hot-location and cool-location sensors, the semiconductor body may also accommodate at least a part of the detection circuit as an integrated circuit (for example, current sources, and/or offset means, such as impedance elements, at least some of which may be temperature responsive in their characteristics and location). Particular circuit features will now be described, which are suitable for integration as well as giving good circuit performance with the output signals of the hot-location and cool-location temperature sensors.

The respective output electrodes of the hot-location and cool-location temperature sensors may be coupled in respective first and second current paths of the detection circuit for drawing a current of the same magnitude through each sensor cell of the hot-location and cool-location temperature sensors, the magnitude of the current being insufficient to generate heat in the sensor cells. A first input of the comparator means may be coupled to a first circuit node in the first current path, and a second input of the comparator means may be coupled to a second circuit node in the second current path. A suitable input level for the comparator may be provided by coupling a first series resistance between the first circuit node and the output electrode of the hot-location temperature sensor, and a second series resistance may be coupled between the second circuit node and the output electrode of the cool-location temperature sensor.

The magnitude of the current drawn through each sensor cell may be determined in a simple manner by coupling external resistances of high value between the sensor output electrodes and a voltage supply. Preferably, however, use is made of current sources coupled together in a current mirror arrangement having a control input. Such an arrangement provides a more accurate way to define the magnitude of the current drawn through each sensor cell. Typically the hot-location and cool-location temperature sensors may each comprise the same number of sensor cells, each with the same cell area, and so the current sources may draw a current of the same magnitude through the source electrodes of the hot-location and cool-location temperature sensors. However, there may be a different number of active sensor cells in the hot-location and cool-location temperature sensors, or they may have different cell areas. In this situation, currents of different magnitude will flow through the source electrodes of the different temperature sensors.

As compared with the cool-location sensor, additional resistance may be coupled in series with the source electrode of the hot-location sensor for adding a voltage offset to the voltage between the source electrode of the hot-location temperature sensor and the common insulated-gate electrode. The voltage offset defined by this additional resistance may then correspond to a temperature difference threshold which is to be detected between the hot and cool locations. Instead of providing the comparator inputs with an external offset in this way, a more complex comparator circuit may be used having an internal offset applied to its inputs.

A temperature-responsive offset means may be coupled in series with the output electrode of the hot-location sensor (for example in parallel with at least a part of an offset additional resistance in this path) for detecting a temperature difference threshold between the hot and cool locations that varies with increasing temperature of the cool location. This temperature-responsive offset means may be used to compensate for a change in the output signal from the cool-location sensor due to an increase in temperature of the cool location. In one form, the temperature-responsive offset means may be a temperature-sensitive diode means having a negative temperature coefficient so that the temperature difference threshold (detected between the hot and cool locations) reduces with increasing temperature of the cool location. The temperature-sensitive offset means may be located in an area of the body that is at the same temperature as the cool-location temperature sensor in operation of the device, for example in an area adjacent to the cool-location temperature sensor.

The semiconductor body may accommodate a comparator means which forms a part of the detection circuit and which has first and second inputs coupled to the respective output electrodes of the hot-location and cool-location temperature sensors. A compact integrated device can be formed, packaged in the same device envelope. Alternatively an external comparator may be coupled to external terminals of the device.

BRIEF DESCRIPTION OF THE DRAWINGS

These and other features in accordance with the invention are illustrated in embodiments of the present invention, now to be described by way of example with reference to the accompanying diagrammatic drawings, in which.

It should be noted that all the Figures are diagrammatic and not drawn to scale. Relative dimensions and proportions of parts of the drawings have been shown exaggerated or reduced in size, for the sake of clarity and convenience in the drawings. The same reference signs are generally used to refer to corresponding or similar features in modified and different embodiments.

DESCRIPTION OF THE PREFERRED EMBODIMENTS

Figure 1:
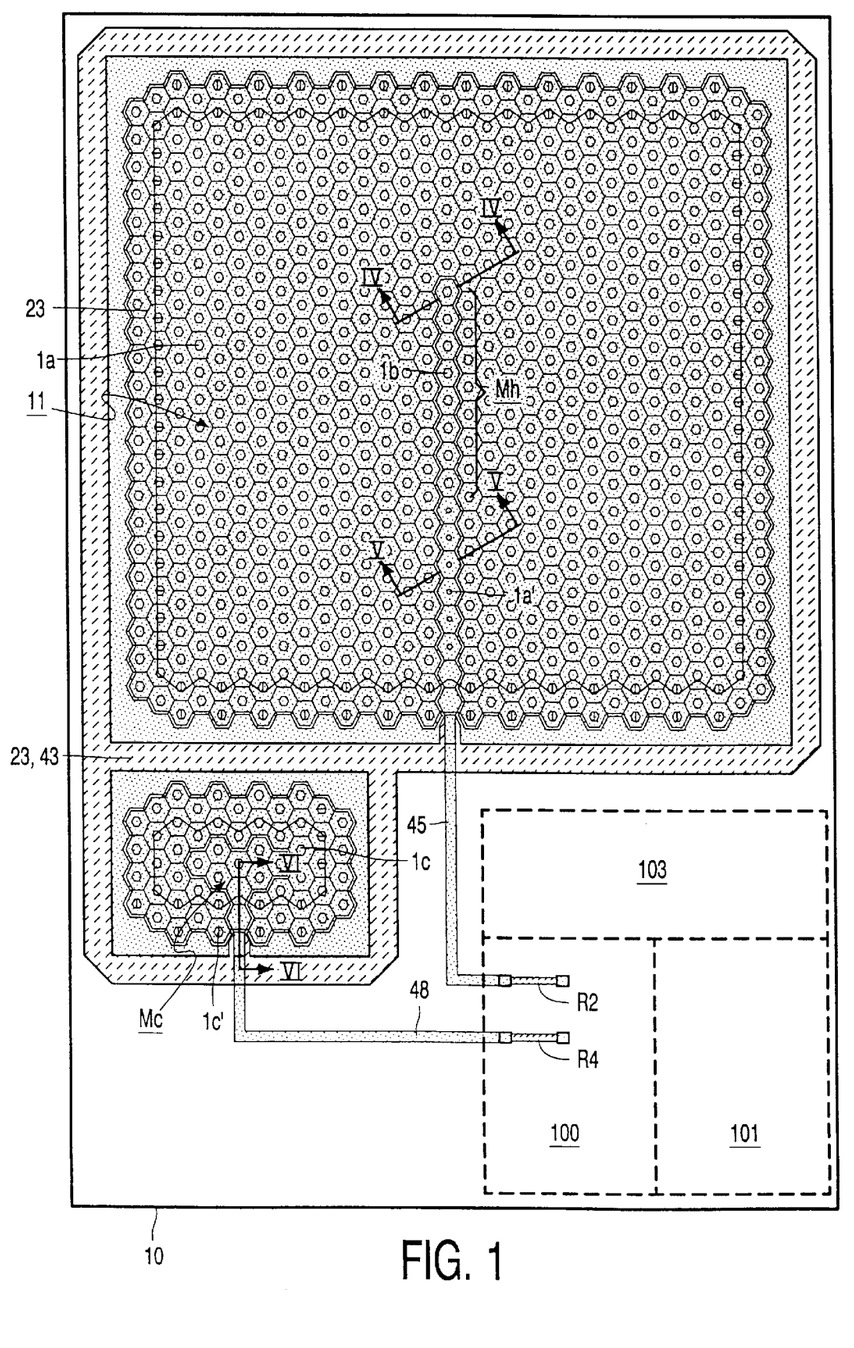
FIG. 1 is a plan view of a part of one example of an insulated-gate cellular power device in accordance with the present invention.

FIG. 1 shows part of a power transistor device of an insulated-gate type, comprising a semiconductor body 10 which accommodates an array 11 of device cells 1a in which heat is generated in operation of the device, a hot-location temperature sensor Mh which is located inside the array 11, and a cool-location temperature sensor Mc. The cool-location temperature sensor Mc is located outside the array, away from the device cells 1a in which the heat is generated. In the device of FIG. 1, the body 10 also accommodates an integrated circuit, for example, a detection circuit 100,101 of FIG. 3 (comprising a comparator 40, current sources M1 to M6, resistance elements R1 to R5, and a temperature-responsive diode means D1) to which the hot-location and cool-location temperature sensors Mh and Mc are coupled. The circuit elements of the integrated detection circuit 100,101 (each having their own element layout) are fabricated using some of the same masking, doping, deposition and/or etching steps as are used for the array 11.

Figure 4:
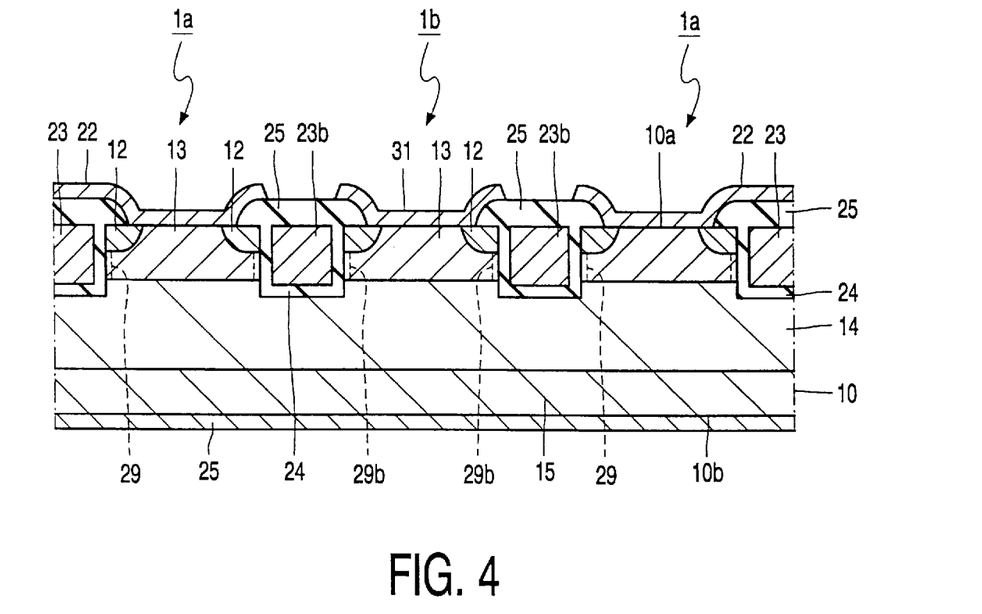
FIGS. 4 and 5 are cross-sectional views of parts of the semiconductor body of the device of FIG. 1, through array areas, on the lines IV—IV and V—V respectively in FIG. 1.
Figure 5:
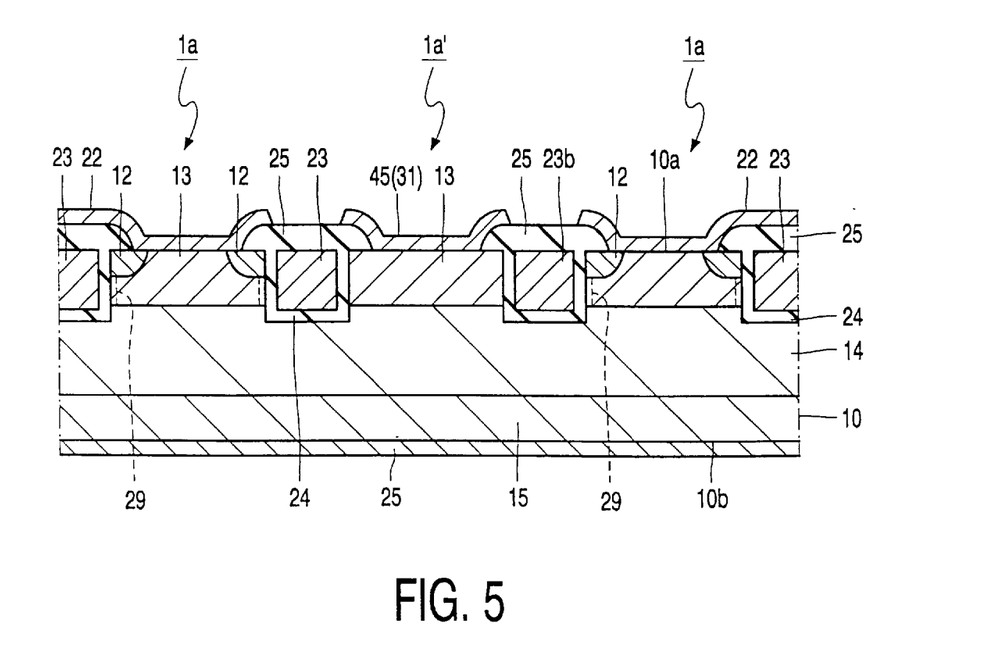

The body 10 is typically of monocrystalline silicon, and the device may typically be a MOSFET or an IGBT. The array 11 typically comprises thousands of parallel device cells 1a in the semiconductor body 10 adjacent to a body surface 10a. Only a small array is shown in FIG. 1, for the purpose of illustrating the device arrangement adopted to embody the present invention. The cellular region structure of each cell 1a may be of any known form, a simple example of which is shown in FIGS. 4 and 5. Thus, each cell 1a may typically comprise a body region 13 of opposite conductivity type (for example p-type in the case of an N-channel enhancement device) which accommodates a conduction channel 29 between a high-doped source region 12 and another region 14, both of a first conductivity type (n-type in this example). The gate electrode 23 is common to all the device cells 1a of the array 11. The application of a voltage signal to the gate electrode 23 in the on-state of the device serves in known manner for inducing the conduction channel 29 in the region 13 and so controlling current flow in this conduction channel 29 between the main electrodes 22 and 25 of the device. A trench-gate configuration is illustrated by way of example in the FIGS. 4 to 6 embodiment, i.e. the gate electrode 23 is present in a trench in the surface 10a and controls current flow in the conduction channel 29 adjacent to a gate dielectric layer 24 at the side-wall of the trench.

As illustrated in FIGS. 4 and 5, the source region 12 is contacted by a source electrode 22 at the top major surface 10a of the body 10. This source electrode 22 is common to all the device cells 1a of the array 11 and forms one main electrode of the power device. By way of example, FIG. 4 shows a vertical device structure in which the region 14 may be an epitaxial layer of high resistivity which forms a low-doped (drain-drift) region on a substrate region 15 of high conductivity. This substrate region 15 may be of the same conductivity type (n-type in this example) as the region 14 to provide a vertical MOSFET, or it may be of opposite conductivity type (p-type in this example) to provide a vertical IGBT. In this vertical device, the substrate region 15 is contacted at the bottom major surface 10b of the device body 10 by the other main electrode 25, called the drain electrode in the case of a MOSFET and called the anode electrode in the case of an IGBT.

In the plan view of FIG. 1 a close-packed hexagonal geometry is illustrated for the device cells 1a of the array 11. However it will be evident that the invention may be used with devices having quite different, known cell geometries, for example the cells 1a may have a square geometry or an elongate stripe geometry. The trench-gate 23 extends around the boundary of each cell 1a of FIG. 1, as a network structure forming a common insulated-gate electrode of the array 11. The source electrode 22 extends over an insulating layer 25 on the trench-gate 23 and also shorts the p-n junction between the source region 12 and the body region 13.

The active cellular area of the device may be bounded around the periphery of the array 11 and the periphery of the body 10 by various known peripheral termination schemes. Such termination schemes normally include the formation of a thick field-oxide layer around the peripheral area of the body surface 10a, before the transistor cell fabrication steps. FIG. 1 illustrates, by way of example, a known peripheral termination scheme for the array 11, in which the conductive layer forming the trench-gate 23 extends on the thick field-oxide as a field-plate. Furthermore, in this known termination scheme, the device cells of the two outermost rows of the array 11 are inactive, due to the absence therefrom of the source region 12 and/or the absence of contact by the source electrode 22.

Figure 6:
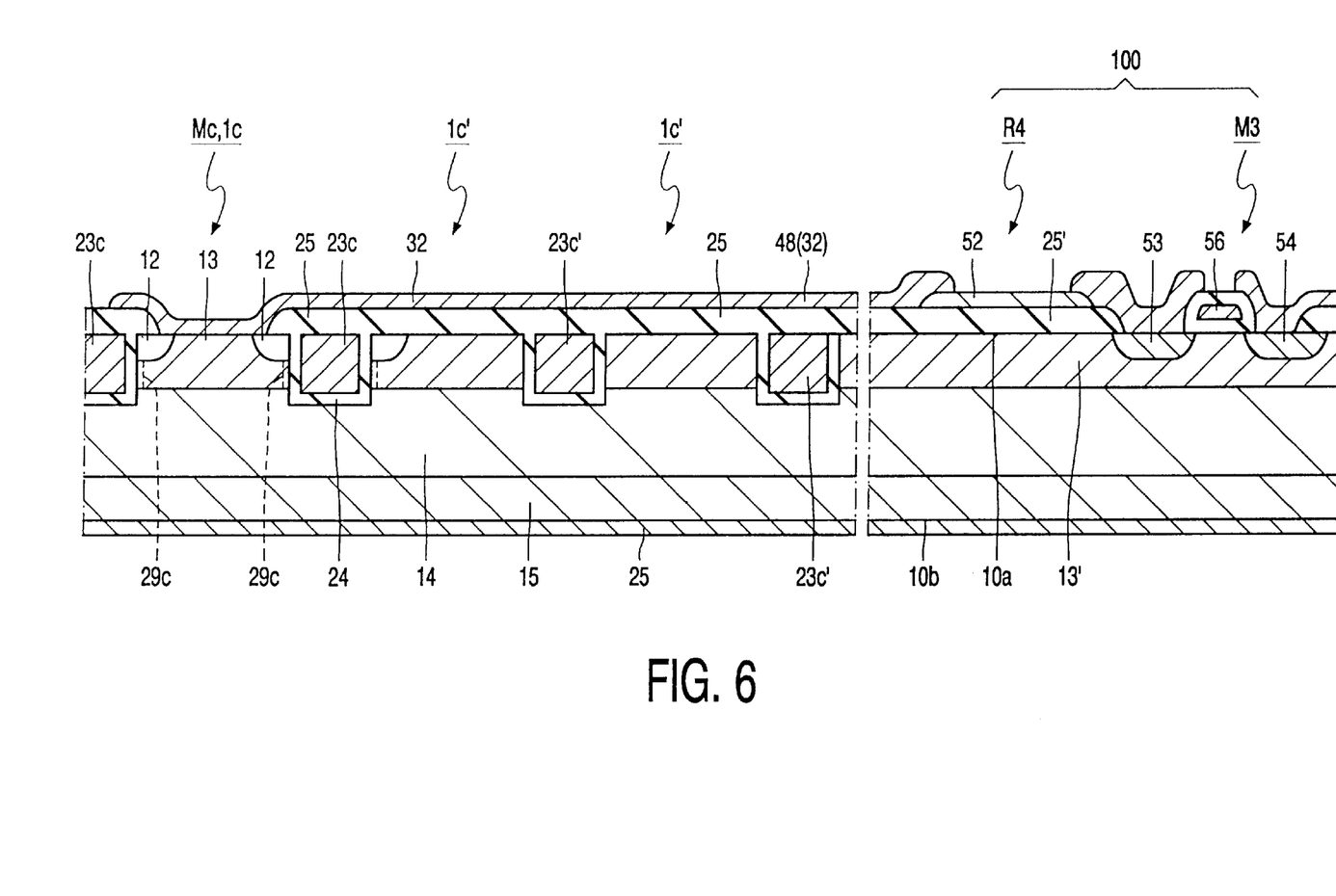
FIG. 6 is a cross-sectional view of part of the semiconductor body of the device of FIG. 1, through the cool-location sensor (i.e. on the line VI—VI in FIG. 1) and through a part of a peripheral circuit.

In terms of a general overview of the temperature sensing function in the device of FIG. 1, the detection circuit 100,101 detects a temperature difference between the hot and cool locations, by comparing gate-source voltage signals from the hot-location and cool-location temperature sensors Mh and Mc, respectively. As illustrated in FIGS. 4 and 6, both the hot-location and cool-location temperature sensors Mh and Mc have a cellular region structure 12 to 15 which is similar to that of the device cells 1a.

Thus, the hot-location temperature sensor Mh comprises at least one sensor cell 1b, the cellular region structure 12 to 15 of which is similar to that of the device cells 1a, as illustrated in FIG. 4. By way of a specific example, FIG. 1 illustrates eight such sensor cells 1b which are arranged in a row (one cell wide) that is bounded (at one end and along its longitudinal sides) by heat-generating device cells 1a within the array 11. These sensor cells 1b have a common source electrode 31 which is separate from the common source electrode 22 of the device cells 1a. However, the sensor cells 1b have their second main electrode 25 common with that of the device cells 1a, and an insulated-gate electrode 23b which is common with the electrode 23 of the device cells 1a. These sensor cells 1b are operated at a low current density (as described below), while the neighbouring device cells 1a which bound the sensor cells 1b are operated at the same high current density as the other active device cells 1a of the array 11. Thus, the temperature of these neighbouring device cells 1a as measured by the sensor cells 1b matches the device operating temperature within the array 11.

The cool-location temperature sensor Mc comprises at least one sensor cell 1c having a cellular region structure 12 to 15 corresponding to that of the hot-location sensor cell 1b, as illustrated in FIG. 6. By way of a specific example, FIG. 1 illustrates seven such sensor cells 1c which are staggered in two groups of four, with a common middle cell, parallel to the periphery of the heat generating array 11. In this particular example, the combined group of cool-location sensor cells 1c is bounded at its ends and along its sides by at least two outer rows of inactive cells 1c' (see FIG. 6). The sensor cells 1c and the peripheral inactive cells 1c' are close-packed in a hexagonal arrangement.

The cool-location temperature sensor Mc has a source electrode 32 which is separate from the common source electrode 22 of the device cells 1a and also separate from the separate source electrode 31 of the hot-location sensor Mh. The sensor cells 1c of the cool-location temperature sensor Mc comprise a common main electrode 25 with the device cells 1a. The insulated-gate electrode 23c of the sensor cells 1c is also coupled in common with the gate 23 of the device cells 1a so as to be at the same potential. This common coupling of the gates 23c and 23 can be achieved in a variety of ways. When the cool-location sensor Mc is located near the array, then the layer structure that provides the gate 23 of the array 11 may be extended into the location of the sensor Mc to provide the gate 23c. FIG. 1 illustrates a specific example of such a structure. However, a more versatile layout arrangement may be adopted in which the common coupling comprises a separate conductor track 43 connected between the gates 23 and 23c.

The present invention enables the temperature at the core of the power device array 11 to be sensed by utilising the temperature sensitivity of the cellular region structure 12 to 15 of the device itself. This is achieved by sensing the temperature differential between the cell(s) 1b deep in the power device array 11 and the cell(s) 1c in the cooler peripheral circuit area of the body 10. The temperature difference between the sensor cells 1b and 1c is substantially proportional to the difference dV(T) in their gate/source voltages Vgs, when the cells 1b and 1c are operating at the same low current density. Because of the nature and positioning of the sensor cells 1b and 1c, the response time of this temperature sensor can be very fast, for example 10 μs (microseconds) to 50 μs. This very quick response time is facilitated by using (temperature-sensing) channels 29b of the cells 1b within the array 11, each hexagonal cell 1b being surrounded on four of its six sides (five of its six sides in the case of the end cell 1b) by power-dissipating channels 29 which are only a few micrometers away in the device cells 1a.

Figure 2:
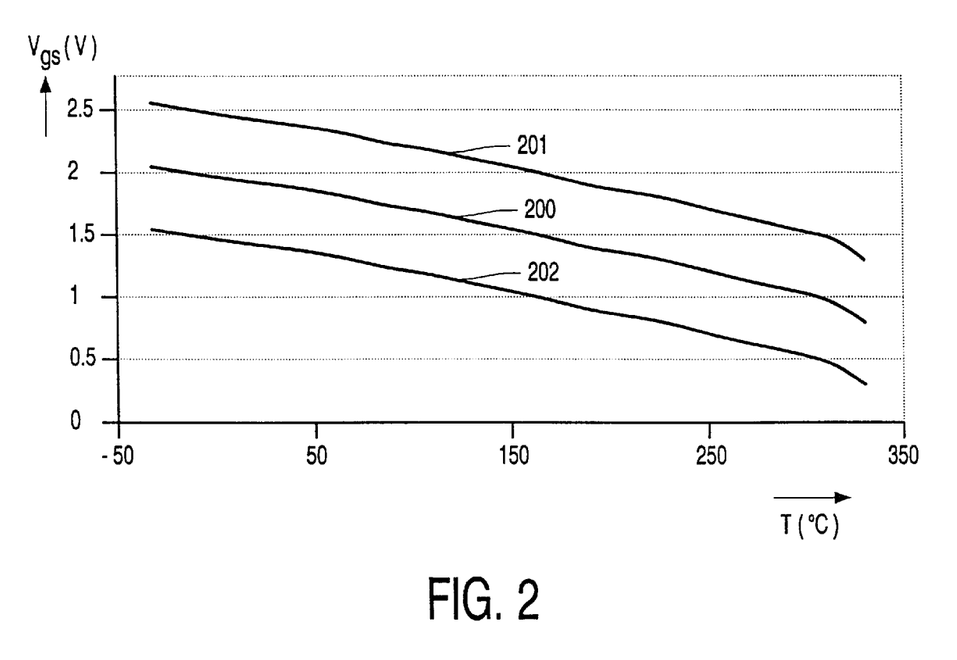
FIG. 2 is a graph showing examples of the change in gate-source voltage Vgs in volts with temperature in ° C. for a typical cell in such a device, showing also the variation which may arise from threshold-voltage differences due to variations in the manufacturing process both for different manufacturing batches.

FIG. 2 illustrates the temperature sensitivity of the gate-source voltage (Vgs) of cells 1b and 1c at a given low drain current, for example of the order of μAmps. The middle curve 200 corresponds to a typical temperature characteristic for a typical cell 1b, 1c. The curves 201 and 202 show maximum and minimum variations in the typical characteristic 200 due to variations in threshold voltage for the cells 1b, 1c arising from the same manufacturing process used at different times to produce different batches of the same device. It can be seen from FIG. 2 that these variations in the characteristic 200 due to the manufacturing process are greater than the variation of the characteristic 200 over a temperature range in excess of 60° C. However, there is little (if any) variation in threshold voltage between the cells 1b and 1c integrated on the same semiconductor body 10, manufactured together in the same batch. Thus, regardless of which of the curves 200 to 202 the temperature characteristic of the cells 1b and 1c is closest to, substantially the same difference dV(T) in Vgs will be obtained between the cells 1b and 1c of a given body 10 for a given difference in temperature T ° C. Thus, the comparison of the voltage signals Vgs from the source electrodes 31 and 32 of these integrated cells 1b and 1c by means of the detection circuit 100, 101 effectively cancels threshold-voltage variations arising from manufacture. By subtracting the gate-source voltages of these cells 1b and 1c at the same current density, the resultant voltage dV(T) is directly representative of the temperature difference between the sensors Mh and Mc.

Figure 3:
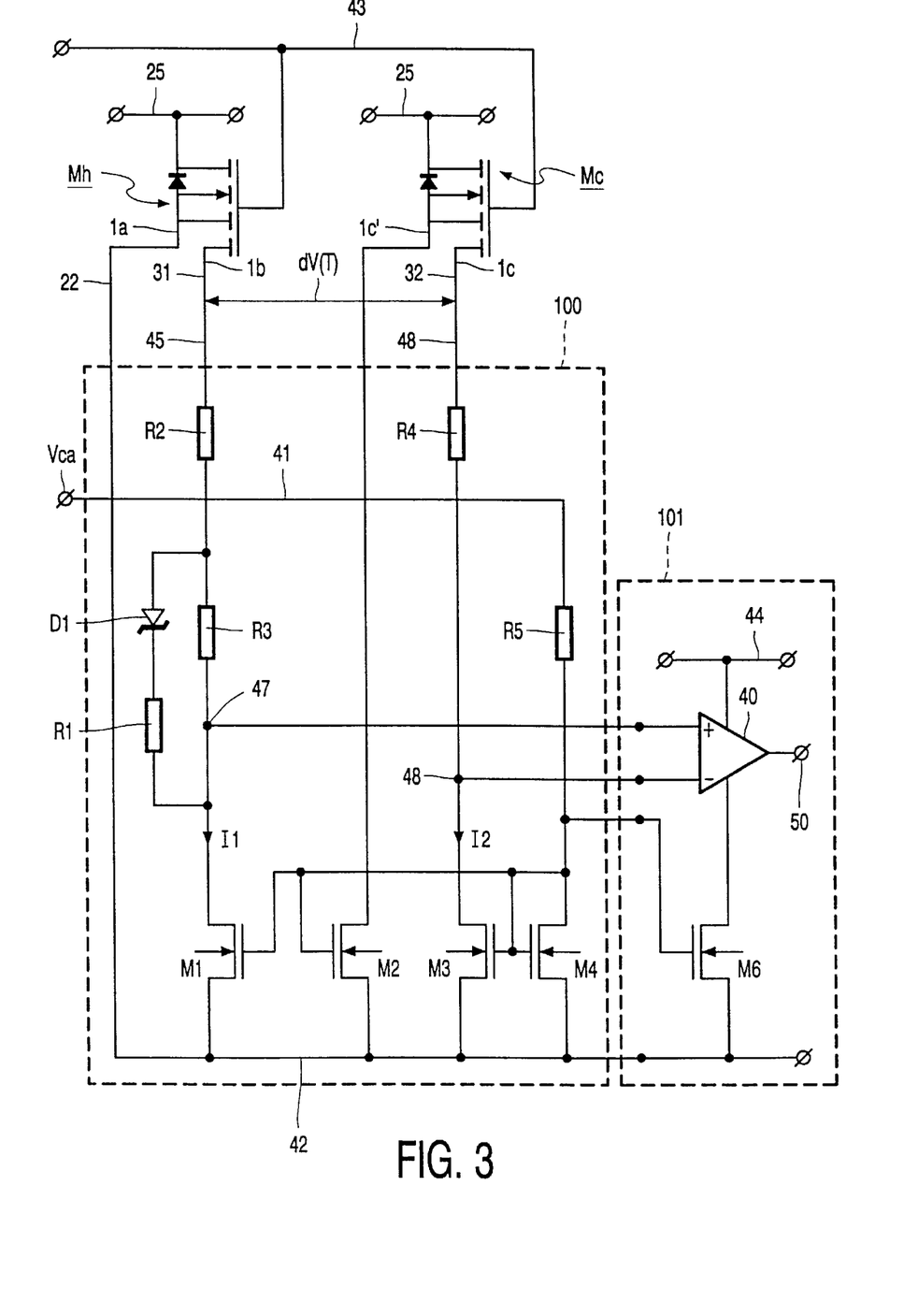
FIG. 3 is a circuit diagram of one example of a detection circuit coupled to hot-location and cool-location temperature sensors of the device of FIG. 1.

FIG. 3 illustrates a specific example of a detection circuit 100, 101 for carrying out this voltage signal comparison. The detection circuit has a first circuit section 100 comprising an impedance network R1, R2, R3, R4 and D1 with a current mirror arrangement M1 to M4, and a second circuit section 101 comprising a comparator 40. The current mirror arrangement comprises MOSTs M1 to M4 which are of the n-channel enhancement type. The MOSTs M1 and M3 form current sources that draw equal constant current densities through the cells 1b and 1c respectively of the sensors Mh and Mc. These current sources M1 and M3 are coupled together in a current mirror arrangement with a control MOST M4. The MOST M4 is diode-connected by having its gate coupled to its source, as well as to the gates of M1 and M3. The main current path through M4 is coupled between the common line 42 and a series resistance R5 of high value, and by this series resistance R5 to the Vca voltage supply line 41. This connection of M4 to the Vca voltage supply line 41 determines the magnitude of current through M4, so providing a control input to the current mirror and thereby defining the magnitude of the current drawn through each sensor cell 1b and 1c by their respective current sources M1 and M3.

The temperature sensing cells 1b and 1c are operated at a low current density, which prevents self heating. When the sensors Mh and Mc have equal numbers of cells 1b and 1c of equal area, identical measurement currents I1 and I2 are drawn from the sensors Mh and Mc by the current sources M1 and M3. This is the situation illustrated in FIG. 1. If Mh and Mc have different numbers of cells and/or cells of different area, then I1 and I2 are of correspondingly different magnitudes (to give the same current density in Mh and Mc), as determined in known manner by an area ratio of the MOSTs M1 and M3. In each case, the magnitude of the current drawn through each cell 1b and 1c is insufficient to generate heat by power dissipation in the cells 1b and 1c.

FIG. 3 uses a complex MOST symbol for the sensors Mh and Mc, so as to depict both their active sensor cells 1b and 1c and the respective adjacent cells 1a and 1c' which act as peripheral boundary cells of the sensors Mh and Mc. The source electrode of the peripheral boundary cells 1a of Mh is the common source electrode 22 of the power device and is coupled directly to the line 42. In the example illustrated in FIG. 3, the source electrode of the peripheral boundary cells 1c' of Mc is coupled to the line 42 via a MOST M2 in the current mirror arrangement, but it may alternatively be coupled directly to the common gate line 43.

The impedance network of R1, R2, R3, R4 and D1 develops a reference offset which is added to the respective source output voltages on cell electrodes 31 and 32 to permit a direct comparison to be made by the comparator 40. Thus, the source electrode 31 of the hot-location cells 1b is coupled to the supply line 42 by the current source M1 and by series resistors R2 and R3, optionally together with a diode D1 and resistor R1 in parallel with R3. The source electrode 32 of the cool-location cells 1c is coupled to the supply line 42 by a current path comprising the current source M3 and a series resistor R4. The potential difference occurring between the source electrodes 31 and 32 is designated as dV(T). This impedance network of R1, R2, R3, R4 and D1 develops a reference voltage offset that is equal to the maximum permissible value of dV(T), relating to the maximum permissible temperature differential Tdiff. This offset is compared by the comparator 40 to the actual value of dV(T) derived from the sensor cells 1b and 1c, so as to provide an output signal for triggering protection of the power device when an excessively high temperature difference occurs.

The comparator 40 has first and second inputs coupled to respective first and second circuit nodes 47 and 48 in the current paths from the cells 1b and 1c respectively. These circuit nodes 47 and 48 are present between the impedance network R1, R2, R3, R4 and D1 and the current sources M1 and M3. In the specific example of FIG. 3, the comparator 40 is powered between supply lines 44 and 42, being coupled to the line 42 by an MOST M6 which is regulated by the current-mirror MOST M4. As compared with the cool-location sensor Mc, the additional resistance coupled in series with the source electrode 31 of the hot-location sensor Mh adds the voltage offset at the circuit node 47, corresponding to a temperature difference threshold Tdiff to be detected between the hot and cool locations. Detection of this voltage offset is indicated by the change in output signal at the output 50 of the comparator 40.

Two sensing modes of operation are possible, depending on whether a temperature-sensitive impedance (such as the diode D1 which has a negative temperature coefficient) is included in the impedance network R1, R2, R3, R4 and D1. If no temperature-sensitive impedance is included, then only a fixed reference offset voltage is provided by the network (consisting of, for example, R2 to R4), and so the comparator 40 detects only a fixed temperature difference Tdiff between the sensors Mh and Mc. The maximum permissible temperature of the sensor Mh inside the array 11 will then vary in accordance with the temperature of the "cool" location, i.e. as a fixed offset from the temperature of the cool-location sensor Mc. However, as can be seen from FIG. 2, there is an increased sensitivity in output voltage from each sensor as its temperature increases.

It may be advantageous to include a temperature-sensitive impedance (such as D1) so that the detected temperature difference threshold Tdiff can be varied depending on the actual temperature of the cool-location. Thus, FIG. 3 illustrates a circuit in which a negative-temperature-coefficient diode D1 is coupled in parallel with the additional resistance in the current path from the hot-location sensor Mh. This diode D1 is located in an area 100 of the body 10 that is at the same temperature as the cool-location sensor Mc in operation of the device. By this means, the resistance of the parallel arm of D1 and R3 can be designed to decrease over a given temperature range, (for example 85° C. to 150° C.) so that the voltage reference offset at the circuit node 47 can be made to inversely track the temperature at the cool-location sensor Mc. This inverse tracking of the voltage reference offset permits the trip point of the comparator 40 (for a given temperature of the sensor Mh within the array 11) to be made less dependant on the temperature at the cool-location sensor Mc over this temperature range.

Typically the maximum permissible operating temperature within the array 11 may be in the range of 350° C. to 400° C., whereas the maximum permissible operating temperature in the peripheral, cool-location circuit areas (such as the circuit sections 100 and 101) may be about 250° C. A further temperature sensing circuit may be accommodated in the body 10, for sensing the absolute temperature of these peripheral circuit areas. This further temperature sensing circuit may be constructed in accordance with the principles disclosed in U.S. Pat. No. 5,336,943 (Our Ref PHB 33762), the whole contents of which are hereby incorporated herein as reference material. This further temperature sensing circuit may be located in an area 103 adjacent to (and isothermal with) the cool-location sensor Mc, away from the array 11. The temperature-sensing impedance D1 (when present) is also located in this same area, isothermal with the further temperature sensing circuit.

The potential difference dV(T) between the two source electrodes 31 and 32 indicates the temperature difference between the two sensors Mh and Mc, when the device is operating with its common second main electrode 25 at a higher potential than the gates 23, 23b, 23c of the cells la, 1b and 1c, and when the measurement currents I1 and I2 are drawn out of the separate source electrodes 31 and 32. As the potential on the electrode 25 reduces below that of the gate 23 during switching of the power device, the cells 1b of the sensor Mh will enter a saturation condition before the cells 1c of the cool-location sensor Mc. As the cells 1b enter saturation, the potential difference dV(T) between the source electrodes 31 and 32 will reduce. This reduction in dV(T) means that the detection circuit becomes progressively less sensitive in detecting a temperature difference between the hot and cool locations, and eventually it would become unable to detect any such differential temperature. However, when the voltage on the electrode 25 is at these low levels, the source-drain (or source-anode) voltage is so very low that the power dissipation is also very low. Thus, although the FIG. 3 circuit will be unable to operate when the cells 1b are saturated, the heat generation in the array 11 is then so small that there is no need for operation of this circuit.

The electrical connection to the source electrode 31 of the sensor Mh inside the array 11 can be formed by a conductor track 45 which extends over a line of device cells 1a' in the array 11. A specific example of such a layout is illustrated in FIG. 1 with the track 45 extending over eight cells 1a'. Typically the sensor Mh may be located much deeper within a large array 11, in which case the track 45 may extend over tens of cells 1a'. The track 45 could extend over an insulating layer over the common source electrode 22 of the array 11. However, in the example of FIGS. 1, 4 and 5, the track 45 is an extension of the source electrode 31 of the sensor Mh. Thus, in the form illustrated in FIGS. 1, 4 and 5, this track 45 is formed from the same metal conductor layer pattern as the source electrodes 22, 31 and 32 and is separated by a gap from the common source electrode 22 of the array 11. In order to accommodate the conductor track 45 of the sensor Mh, the cellular region structure 12 to 15 for the line of cells 1b and 1a' may be made with a slightly larger layout geometry than that for the active device cells 1a of the array 11.

FIGS. 1, 4 and 5 illustrate a specific example of how this conductor track 45 can be electrically isolated from the common gate electrode 23 of the array 11, as well as from the common source electrode 22. In the specific example of FIGS. 1 and 5, the device cells 1a' of the line below the track 45 are inactive cells of the array 11. These inactive cells 1a' have no source region 12 contacted by the common source electrode 22 of the array 11. The source region 12 may be absent from these inactive cells 1a' and/or a contact window in the insulating layer 25 may be narrowed where the body surface 10a may be contacted by the track 45. FIG. 5 illustrates a cross-section showing an inactive cell 1a' under the conductor track 45 and between two active device cells 1a. In the specific example of FIG. 5, the common source electrode 22 of the array 11 is absent from the inactive cells 1a' of the line over which the conductor track 45 extends. The source region 12 of the cellular region structure 12 to 15 is also absent from adjacent to the insulated-gate electrode 23 of these inactive cells 1a'. The conductor track 45 is formed as an integral extension of the source electrode 31 and is electrically isolated from the common gate electrode 23 of the device cells 1a' by the intermediate insulating layer 25.

FIG. 6 illustrates a specific example of how at least the first section 100 of the detection circuit can be integrated with the device of FIGS. 1 and 4. The right-hand extension of the cross-section of FIG. 6 shows a coupling of M3 and R4 to an active sensor cell 1c of Mc, by a conductor track 48 which is an integral extension of the source electrode 32. In this particular embodiment, by way of example, FIG. 6 shows two inactive cells 1c' present at the periphery of the sensor Mc. A similar cross-section could be drawn for a coupling of M1 and R3 to the active sensor cell 1b of Mh, except that a long line of inactive cells 1a is present below the track 45 which extends deep into the array 11 before reaching the first active sensor cell 1b. The N-channel enhancement MOSTs M1 to M4 can be integrated in known manner in a p-type region 13' of the body 10, by forming n-type doped source and drain regions 53 and 54 in the region 13', and an insulated gate 56 at the area of the surface 10a therebetween. The region 13' may be an extension of the region 13 of the sensor cells 1c, or it may be a separate p-type region in the n-type region 14. The resistors R1 to R5 may be formed as thin-film resistors (for example in a layer 52 of polycrystalline silicon) on an insulating layer 25 on the body surface 10A. Alternatively, the resistors R1 to R4 may be formed as doped regions in the body region 13'. The diode D1 may be formed as a thin-film diode in a polycrystalline silicon layer 52 on the insulating layer 25, or it may be formed by doped regions in the body region 13'.

From reading the present disclosure in respect of both the general description and the illustrated embodiments, other variations and modifications will be apparent to persons skilled in the art. Such variations and modifications may involve equivalent and other features which are already known in the design, manufacture and use of semiconductor devices and component parts thereof and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention. Although the dependency of subsidiary Claims has been limited in the interests of meeting the requirements and reducing the fees for multiple-Claim-dependency in some countries, it should be understood that technical features included in any one Claim may be used in combination with technical features of any one of the other Claims. Particularly, but not exclusively, the following combinations are potentially important: features of claims 5, 6, 7, 9 and 10 may be used in combination with features of any one of the Claims dependent on claim 1. Although the present invention may be embodied with a bipolar transistor cellular structure for the power device and the temperature sensors, it is particularly advantageous with an insulated-gate transistor cellular structure. Thus, insulated-gate transistor cellular structures for the power device and the temperature sensors are potentially important not only for claim 5 but also for all of the other Claims.

The Applicants hereby give notice that new Claims may be formulated to any such features and/or combinations of such features during the prosecution of the present Application or of any further Application derived therefrom.

What is claimed is:

1. A power transistor device comprising a semiconductor body which accommodates an array of parallel device cells of a transistor type, heat being generated in the device cells in operation of the device, wherein a hot-location temperature sensor is located inside the array of device cells, the body also accommodates a cool-location temperature sensor which is located outside the array, the cool-location and hot-location temperature sensors each comprise at least one sensor cell which is of said transistor type with a cellular region structure similar to that of the device cells and with a respective output electrode for each temperature sensor which is separate from electrodes of the device cells, and a detection circuit is coupled to the respective output electrodes of the hot-location and cool-location temperature sensors for detecting a temperature difference between the hot and cool locations by comparing voltage signals from the output electrodes and is capable of operating when the device is operated outside a saturation region.

2. A power device as claimed in claim 1, wherein the body also accommodates a part of the detection circuit that comprises a comparator means having respective first and second inputs coupled to the respective output electrodes of the hot-location and cool-location temperature sensors.

3. A power device as claimed in claim 2, wherein the respective output electrodes of the hot-location and cool-location temperature sensors are coupled in respective first and second current paths of the detection circuit for drawing a current of the same magnitude through each sensor cell of the hot-location and cool-location temperature sensors, the magnitude of the current being insufficient to generate heat in the sensor cells, the first input of the comparator means is coupled to a first circuit node in the first current path, and the second input of the comparator means is coupled to a second circuit node in the second current path.

4. A power device as claimed in claim 3, wherein a first series resistance is coupled between the first circuit node and the output electrode of the hot-location temperature sensor, and a second series resistance is coupled between the second circuit node and the output electrode of the cool-location temperature sensor.

5. A power device as claimed in claim 1, wherein the device is an insulated-gate transistor type, the device cells of the array have a common source electrode and a common insulated-gate electrode, the sensor cells have an insulated-gate electrode which is coupled to the same potential for each temperature sensor and a source electrode which provides the respective output electrode for each temperature sensor, the detection circuit comprises respective current sources which are coupled in respective current paths to the respective source electrodes of the temperature sensors for drawing a current of the same magnitude through each sensor cell of the hot-location and cool-location temperature sensors, the magnitude of the current being insufficient to generate heat in the sensor cells, and the detection circuit detects a temperature difference between the hot and cool locations by comparing gate-source voltage signals from the hot-location and cool-location temperature sensors.

6. A power device as claimed in claim 1, wherein current sources are coupled together in a current mirror arrangement for defining the magnitude of the current drawn through each sensor cell.

7. A power device as claimed in claim 1, wherein, as compared with the cool-location temperature sensor, additional resistance is coupled in series with the output electrode of the hot-location temperature sensor for adding a voltage offset corresponding to a temperature difference threshold to be detected between the hot and cool locations, for example adding a voltage offset to the voltage between the source electrode of the hot-location temperature sensor and the insulated-gate electrode in the case of an insulated-gate transistor type.

8. A power device as claimed in claim 7, wherein a temperature-responsive offset means, for example a temperature-sensitive diode means having a negative temperature coefficient, is coupled in parallel with at least a part of the additional resistance and is located in an area of the body that is at the same temperature as the cool-location temperature sensor in operation of the device.

9. A power device as claimed in claim 1, wherein the hot-location temperature sensor comprises a plurality of the sensor cells arranged in a row that is bounded along its longitudinal sides by heat-generating device cells of the array.

10. A power device as claimed in claim 1, wherein the coupling to the output electrode of the hot-location sensor comprises a conductor track which extends over a line of the device cells in the array and which is electrically isolated from a corresponding electrode of the device cells, for example from a common source electrode of the array in the case of an insulated-gate transistor type.

* * * * *